United States Patent [19]

Maurinus

[11] Patent Number: 5,302,778
[45] Date of Patent: Apr. 12, 1994

[54] SEMICONDUCTOR INSULATION FOR OPTICAL DEVICES

[75] Inventor: Martin A. Maurinus, Rochester, N.Y.

[73] Assignee: Eastman Kodak Company, Rochester, N.Y.

[21] Appl. No.: 937,791

[22] Filed: Aug. 28, 1992

[51] Int. Cl.$^5$ .............................. H01L 23/02
[52] U.S. Cl. ..................... 174/52.4; 257/432
[58] Field of Search ............... 174/52.2, 52.4; 354/410, 402; 359/808, 811, 819; 257/432, 433, 436; D13/165

[56] References Cited

U.S. PATENT DOCUMENTS

| | | | |
|---|---|---|---|
| 3,624,462 | 7/1971 | Phy | 317/234 |
| 3,964,157 | 6/1976 | Kuhn et al. | 29/591 |
| 4,054,938 | 10/1977 | Morris, Sr. | 361/401 |
| 4,143,456 | 3/1979 | Inoue | 29/588 |
| 4,186,995 | 2/1980 | Schumacher | 350/96.20 |
| 4,295,152 | 10/1981 | Khoe et al. | 357/74 |
| 4,326,214 | 4/1982 | Trueblood | 357/4 |
| 4,351,051 | 9/1982 | van Alem et al. | 372/36 |
| 4,398,240 | 8/1983 | Savage, Jr. | 362/311 |
| 4,419,722 | 12/1983 | Bury | 362/396 |
| 4,471,414 | 9/1984 | Savage, Jr. | 362/226 |
| 4,507,718 | 3/1985 | Bury | 362/396 |
| 4,706,106 | 11/1987 | Shiba et al. | 357/78 |
| 4,727,221 | 2/1988 | Saitou et al. | 174/52 |
| 4,788,885 | 12/1988 | Fries | 74/606 |
| 4,841,100 | 6/1989 | Ignasiak | 174/138 |
| 4,843,036 | 6/1989 | Schmidt et al. | 437/224 |
| 4,953,171 | 8/1990 | Nakajima et al. | 372/44 |
| 4,960,995 | 10/1990 | Neumann et al. | 250/347 |
| 4,967,262 | 10/1990 | Farnsworth | 357/80 |
| 5,037,198 | 8/1991 | Gaboury | 356/218 |

FOREIGN PATENT DOCUMENTS

| | | | |
|---|---|---|---|
| 56-103481 | 8/1981 | Japan | H01L 31/18 |
| 56-103484 | 8/1981 | Japan | H01L 31/18 |
| 58-115526 | 1/1985 | Japan | H01L 27/14 |
| 62-21282 | 1/1987 | Japan | H01L 31/04 |

Primary Examiner—Leo P. Picard
Assistant Examiner—Bot Ledynh
Attorney, Agent, or Firm—David A. Howley

[57] ABSTRACT

A method and apparatus for enclosing an optically active integrated circuit die mounted on a region of a printed circuit substrate within either a unitary optical plastic lens element and enclosure or a discrete lens element and enclosure formed with mechanical standoff tabs and positioning pins for attaching and securing the unitary or discrete enclosure to the circuit substrate. The mechanical tabs of the enclosure have catches that snap in place into receiving apertures in the substrate so as to position the molded plastic lens over the optically active integrated circuit device at a predetermined distance providing the desired focal length. The molded plastic lens of the optical plastic enclosure protects the optically active integrated circuit from damage and images light thereon or therefrom. In a preferred embodiment, the side walls of the plastic enclosure contact the surface of the substrate and enclose the die and the region that the die is mounted on. The remaining volume enclosed within the molded plastic enclosure and lens element may be filled with a transparent epoxy material to provide a unitary, sealed enclosure with the optically active integrated circuit die with the region on the substrate. Preferably, the optically active device is a photosensitive micro-electronic circuit element, e.g. a photosensor or a charge coupled device (CCD).

11 Claims, 4 Drawing Sheets

SEMICONDUCTOR INSULATION FOR OPTICAL DEVICES

BACKGROUND OF THE INVENTION

1. Field of the Invention

The present invention relates generally to encapsulating optically active electronic devices, more particularly to encapsulating such devices mounted on a printed circuit substrate within a pre-formed plastic enclosure having a unitary or a snap-in lens element in one wall thereof for focusing an image on or focusing light from the device.

2. Description of the Prior Art

As electronic optical imaging systems become more compact, particularly with the incorporation of microelectronic photosensor elements for electronic auto exposure systems in relatively compact and inexpensive cameras, it has become desirable to mount the optically active integrated circuit (IC) die on a fiberglass printed circuit board or a ceramic substrate employing chip-on-board technology. The mounting of the optically active IC die directly on or within a recess in a printed circuit board or a substrate allows the inter-connection with its associated circuitry and components to form a relatively compact, flat circuit assembly.

Typically, the optically active semiconductor device is formed as an IC chip containing hundreds or thousands of separate semiconductor devices inter-connected with connection pads to which thin wires extending to printed circuit pads may be bonded. Such a photosensitive IC is disclosed in commonly assigned, U.S. Pat. No. 5,037,198 to Gaboury and incorporated herein by reference. The chip or die itself is characteristically small in size, with dimensions typically on the order of not more than ¼" by ¼" square by 0.015" thick. Despite their small size, these chips in accordance with the prior art were typically packaged in supporting structures many times their size, such as in TO-5 cans with wire connection pins extending from the bottom thereof, flat packages with strip connectors extending from the edges thereof, and ceramic or plastic in-line packages with metal prongs extending out of the opposite edges and bent over to form a unit suitable for plugging into a socket or directly into apertures in a printed or hybrid circuit substrate.

Regardless of the particular package utilized for prior art semiconductor chips, including CCD arrays, their primary drawback involves size and cost of separate packaging. On the other hand, the relatively small size packages provide protection from the environment and handling and allow for relatively fail-safe installation.

In order to achieve miniaturization in the entire printed or hybrid circuit comprising the integrated circuit chips and the printed circuit board or substrate, various techniques have been proposed for eliminating the integrated circuit chip package, including mounting the chip or die directly on a prepared region of the substrate or board and encapsulating it in situ with various resins. In commonly assigned U.S. Pat. No. 4,843,036, of which I am a named co-inventor, and with respect to FIG. 1 of that patent, a method is described for encapsulating such optically active integrated circuit chips 20 on a substrate 10 using a transparent encapsulant 32 deposited within a barrier formed around the chip 20. The encapsulant is deposited in a viscous state in the region contained within the barrier 14 and thereafter is cured under ultraviolet light. The cured encapsulant 32 provides a functional, convex lens-like cross-sectional shape to provide focusing of light onto the optically active surface of the integrated device 20 (a photodiode in the disclosed embodiments).

The '036 patent also describes several prior art patents which describe methods for encapsulating electronic devices using radiation curable polymers. U.S. Pat. No. 4,635,356 to Ohuchi et al. describes a method of encapsulating an electronic device wherein a large, free-form spacer is used as a barrier wall to surround electronic components mounted on a radiation-transparent support. The volume within the barrier wall is filled with a radiation curable material to form the finished device.

A further U.S. Pat. No. 4,054,938 to Morris describes the encapsulation of an integrated circuit chip or die. The die carrier is nested into an aperture in the substrate, and an encapsulation material dam provides a four sided enclosure wall placed in contacting engagement with the top surface of the substrate to surround the integrated circuit chip. A thermo-plastic epoxy material is placed over the chip and its attachment wires to pads on the substrate within the region confined by the dam.

One difficulty encountered following the teachings of these references lies in the control of the shape of the curable resin or thermo-plastic epoxy material so that it consistently forms an optical lens suitably shaped to focus an image on the optically active integrated circuit. Earlier systems for enclosing optically active light detectors or light emitters have involved the incorporation of a transparent window or lens within the protective housing for the optically active semi-conductor device in a manner described, for example, in Japanese application number 58-115526 to Watabe, wherein a solid state image pick up device is provided within a package that itself is adapted to be attached to a printed circuit substrate in a manner described above. A lens element is fitted over the optically active surface of the solid-state pick up device and supported by the side walls of the package. Numerous other examples exist of lens and windows mounted on separate packages for optically active integrated circuit chips where the chips or dies are mounted to substrates of the package, and the IC elements are electrically connected to terminal pins which in turn are inserted into connectors mounted to printed circuit boards or substrates.

It also is known from U.S. Pat. Nos. 4,419,722 to Bury and 4,471,414 to Savage to provide snap-in assemblies for holding light emitting diodes (LEDs) in apertures provided in printed circuit boards to both protect and maintain the LED in its proper location.

There remains a need for a miniaturized, flat and thin unitary electronic assembly comprising an integrated circuit chip or die (hereafter referred to collectively or individually as a die) mounted directly to a printed circuit board or hybrid circuit substrate (hereafter referred to collectively and individually as a printed circuit substrate) and provided with a protective lens assembly that is inexpensive and easy to assemble and provides accurate image focusing onto the optically active microelectronic circuit element(s) of the integrated circuit.

SUMMARY OF THE INVENTION

One important object of the present invention is to thus provide a method and apparatus for assembling an optically active integrated circuit die directly to a printed circuit substrate within a protective, transparent enclosure having an imaging lens formed therein, such that, when assembled, the lens is accurately positioned with respect to the optically active elements of the integrated circuit die.

In accordance with the invention, an apparatus and method of enclosing an integrated circuit die mounted on a region of a printed circuit substrate of the type having conductive paths and connected components on at least one major surface thereof, the die having at least one optically active micro-electronic circuit element, comprises the means for and steps of: forming a region on the substrate for receiving the integrated circuit die; attaching the integrated circuit die in the region so that the optically active integrated circuit elements are electrically connected to the conductive paths and are exposed to light; and attaching an enclosure to the substrate, the enclosure having a lens element formed in or assembled to a wall thereof and suspended over the optically active integrated circuit element and side alls surrounding the integrated circuit die within the region of the substrate to enclose and protect the die.

In accordance with the present invention, a relatively flat and thin electronic circuit assembly is thus formed to enclose an integrated circuit chip or die attached directly to a printed circuit substrate comprising in combination: a printed circuit substrate having conductive paths and connected components on at least one major surface thereof arranged to terminate with connection pads of at least some of the paths spaced in a region of the substrate including an integrated circuit attachment site; an optically active integrated circuit die having at least one optically active circuit element adapted to respond to radiation impinging at least one surface thereof and a plurality of electrical terminal pads spaced thereon and a bottom surface; means for mechanically attaching the integrated circuit die to the site on the printed circuit substrate; means for electrically connecting the connection pads of the substrate to the terminal pads of the integrated circuit die; an integrated circuit enclosure and radiation focusing lens configured to enclose the integrated circuit die in the region of the printed circuit substrate; and means for mounting the enclosure and lens to the major surface of the printed circuit substrate such that the lens is focused on the optically active element of the integrated circuit die.

In a first preferred embodiment, the lens element and enclosure are formed integrally of an optically transparent material, e.g. glass or plastic. In a second preferred embodiment, the enclosure is formed of an opaque material having a lens receiving aperture and the optically transmissive lens element is attached to the aperture of the enclosure.

In a further embodiment, the means for and method of attaching further comprises filling the enclosed volume within the enclosure with a transparent sealing compound extending between the surface of the integrated circuit chip and the lens element in the top wall of the enclosure. Preferably, the side walls have venting apertures for allowing excess sealing compound to escape.

In a still further embodiment, the means for and method of attaching further comprises a plurality of tab means extending into and engaging a like plurality of apertures in the printed circuit substrate, the tab means formed with catches to engage edges of the apertures and hold side wall edge surfaces of the side walls in contact with the surface of the substrate.

In addition, locating pins extending from the edge surfaces of the side walls are preferably employed extending from the enclosure and through a further set of apertures in the printed circuit substrate to precisely locate and stabilize the enclosure during and following its attachment to the substrate.

Optionally, adhesive may be employed to seal the contact seam of the side wall edge surfaces and the substrate surface.

In the first preferred embodiment of the invention, the protective enclosure and lens comprises an optical plastic structure formed in a single piece having side walls adapted to be mounted against and extend from the substrate surface, the side walls having side wall edge surfaces and locating pins for supporting and suspending the lens element above the integrated circuit die and vents for releasing air displaced by sealing compound, and tabs for attaching the side wall edge surfaces of the plastic piece to the substrate surface whereby the plastic piece surrounds and encloses the region in which the integrated circuit die is mounted to the printed circuit substrate. The tabs preferably are formed with leading edge catches dimensioned to fit through the apertures in the printed circuit substrate for engaging the opposite surface of the printed circuit substrate in order to precisely position the lens element a fixed distance above the optically active surface of the integrated circuit die enclosed thereby.

In the second preferred embodiment, the receiving aperture for the lens element includes a seat and peripheral snap catches for engaging the annular edge of the lens element. In use, the enclosure is first attached to the printed circuit substrate, optionally filled with a relatively low viscosity sealing compound, and the lens element is snapped into place against the seat and in contact with the sealing compound, if any. The lens element may displace sealing compound from the vents when the lens element is snapped in place. The sealing compound assists in holding all of the components in place.

BRIEF DESCRIPTION OF THE DRAWINGS

These and other advantages, objects and features of the invention will become apparent from the following description of the preferred embodiments of the invention in conjunction with the drawings in which.

The drawings are not necessarily to scale.

DESCRIPTION OF THE PREFERRED EMBODIMENTS

Figure 1:
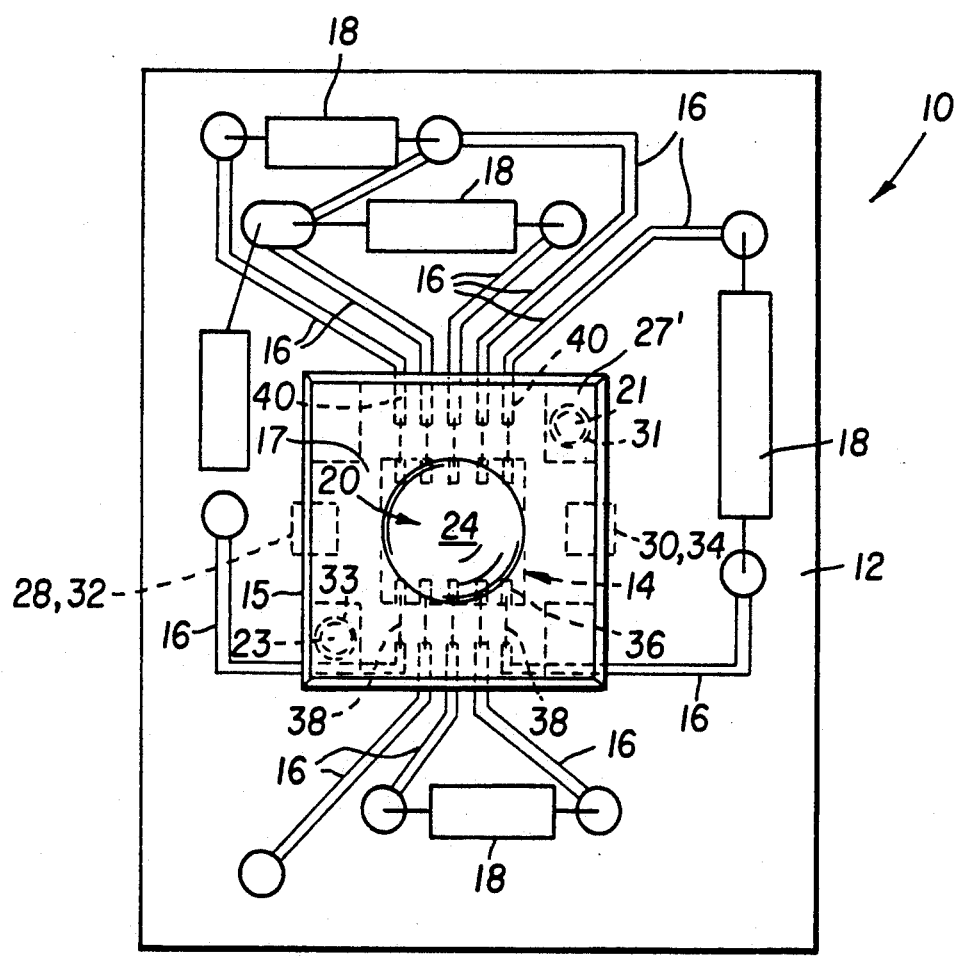
FIG. 1 is a plan assembly view of an integrated circuit die attached to a site in a region of a printed circuit substrate and within a transparent, protective enclosure and lens element formed as a single piece.

Turning now to the drawings of the preferred embodiments of the present invention, FIG. 1 is a top view of the assembly 10 of a printed circuit substrate 12, an integrated circuit (IC) die 14 and a protective, transparent, unitary lens and enclosure 15. FIG. 1 is intended to illustrate the general relation of all of the elements of each of the preferred embodiments when assembled, but will be described, for convenience, in reference to the first embodiment of FIGS. 2-4.

Figure 2:
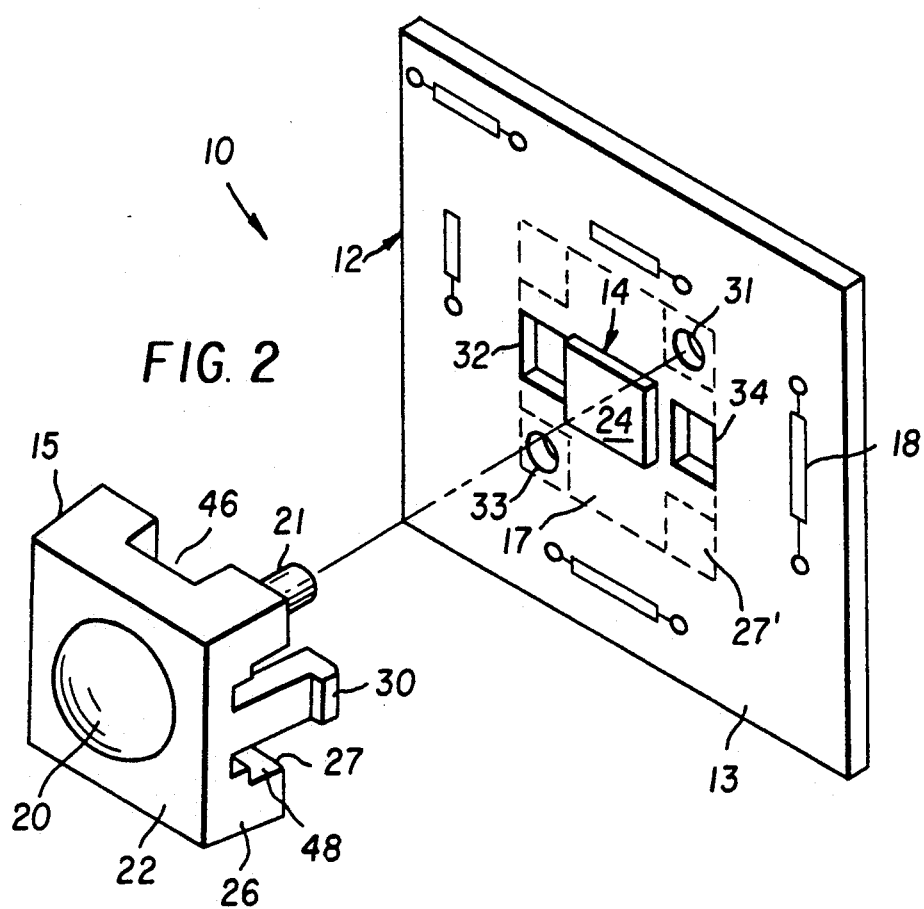
FIG. 2 is an exploded perspective view of a first embodiment of the integral protective enclosure and the printed circuit substrate and integrated circuit die assembly of FIG. 1.
Figure 3:
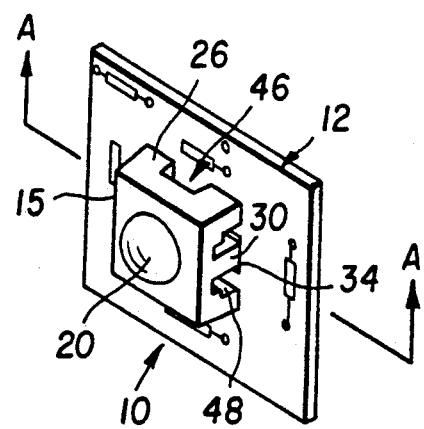
FIG. 3 is an assembled perspective view of the embodiment of FIG. 2.
Figure 4:
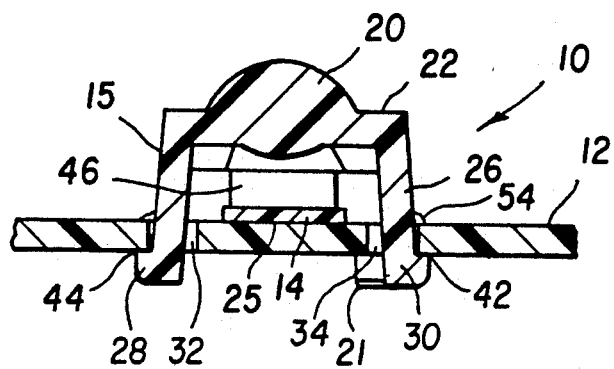
FIG. 4 is a cross-section elevation view taken along lines A—A of FIG. 3 depicting a first embodiment of the attachment of the protective enclosure to the printed circuit substrate.
Figure 5:
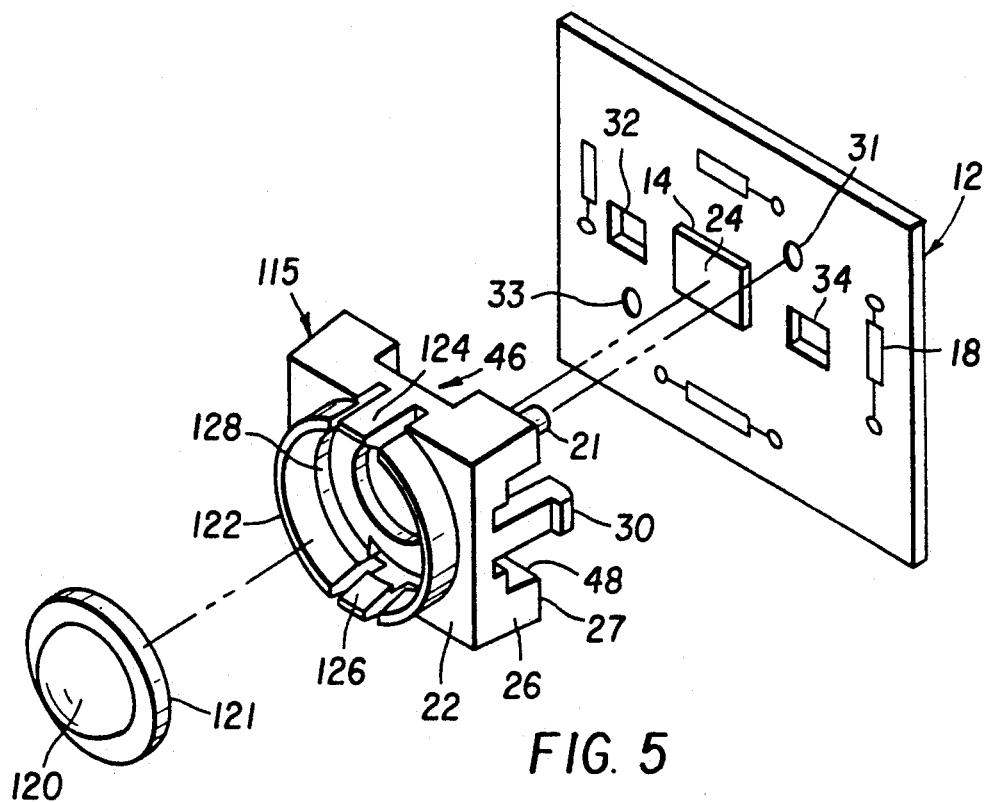
FIG. 5 is an exploded, front perspective view of a second embodiment of the protective enclosure and the printed circuit substrate and integrated circuit die assembly of FIG. 1.
Figure 6:
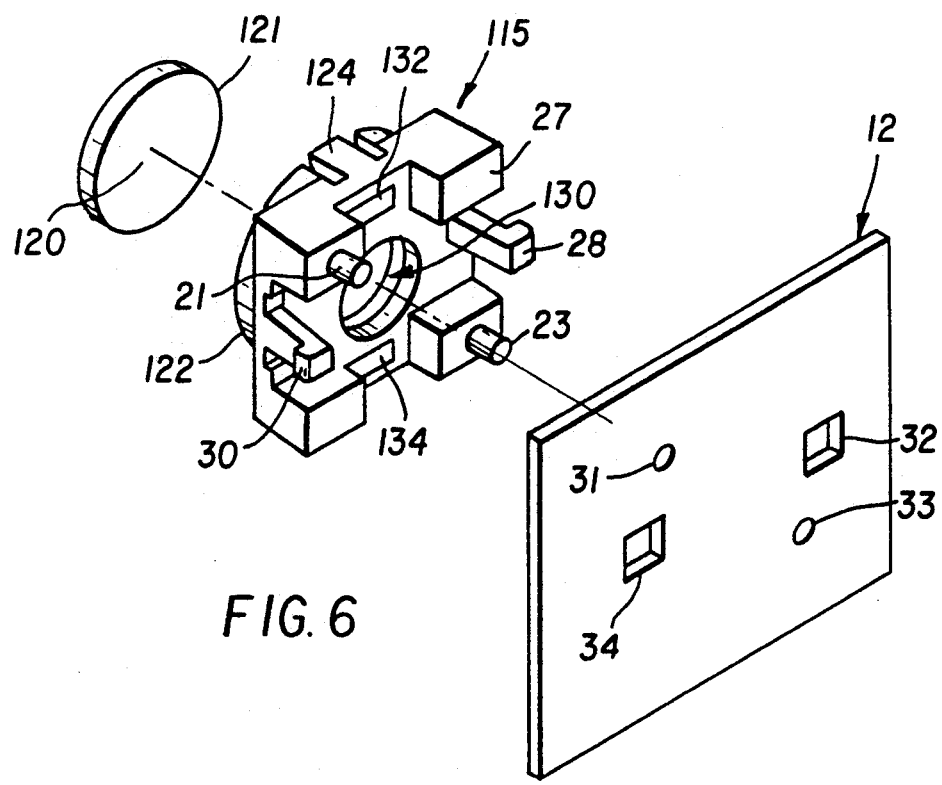
FIG. 6 is an exploded, rear perspective view of the second embodiment of the protective enclosure and the printed circuit substrate and integrated circuit die assembly of FIG. 1.

FIG. 2 illustrates the assembly 10 with the unitary lens and enclosure 15 suspended over and enclosing the region 17. As shown in the cross-section views of FIG. 4, the preferred embodiments of the enclosure 15 are molded of an optical plastic in a box-like shape having a lens element 20 in the top wall 22. When assembled, as shown in FIGS. 3 and 4, the lens element 20 focuses an image onto the image receiving surface 24 of the IC die 14. As described in the above-incorporated '198 patent, the image receiving surface 24 may comprise one or more photosensitive microelectronic circuit elements.

Returning to FIG. 1, the printed circuit substrate 12 may comprise a thin sheet of ceramic or fiberglass material deposited or imprinted with a number of electrically conductive paths 16 that may be formed on the substrate 12 using any suitable process, for example by thick-film deposition when the substrate 12 comprises a ceramic, or by etching when the substrate comprises a fiberglass printed circuit board. The paths 16 may be attached to discrete electronic components 18 which may be either deposited to a ceramic substrate and trimmed in a manner well known in the art of hybrid circuit fabrication or may constitute discrete components having lead wires that are attached to the pads of the conductive paths 16 by ultrasonic welding or soldering in a manner well known in the art of assembling discrete components to printed circuit boards and ceramic substrates.

The conductive paths 16 extend into and terminate within the region 17 outlined in FIG. 2. The region 17 is surrounded by the "footprint" for the side wall edge surfaces 27 of the side walls 26 of the enclosure 15. The enclosure 15 is constructed with a pair of tabs 28 and 30 having tapered leading ends with notches and shoulders formed therein for insertion into apertures 32 and 34, respectively, formed in the printed circuit substrate 12.

The IC die 14 is provided with a number of connector pads 36 arrayed on either side of the imaging receiving surface 24 that are adapted to be connected by lead wires 38 to miniaturized terminal pads 40 formed at the ends of the conductive paths 16 within the region 17. It will be understood that the lead wires 38 comprise any suitable electrical conductors connected to the terminal pads 40 and connector pads 36 by any suitable bond. For example, the conductors 38 can comprise ultrasonically bonded wires or soldered Tape Automated Bonding (TAB) leads.

The other surface 25 of the IC die 14 is preferably cemented to the substrate surface 13 of the printed circuit substrate 12 at a predetermined site within the region 17 by applying a dab of adhesive having a negligible thickness thereto. Alternative methods of mounting the die 14 to the printed circuit substrate 12, e.g. in an aperture formed in the substrate 12, are described in the above-referenced '938 patent.

The unitary lens and enclosure 15 is constructed with the convex lens element 20 extending superiorly of its top surface 22. The height of the side walls 26 and the shape of the lens element 22 are selected with respect to the thickness and positioning of the mounted IC die 14 in order to focus an image onto the photosensitive surface 24. In accordance with the present invention, the unitary transparent lens and enclosure 15 takes the place of the encapsulant and barrier described in the above incorporated '036 patent. The construction and principles of operation of the unitary lens and enclosure 15 are described in relation to the preferred embodiments thereof illustrated in FIGS. 3-6.

Turning now to FIG. 3 and 4, they illustrate in an assembled perspective and a side elevation, cross-section view, respectively, the first embodiment of the attachment of the unitary lens and enclosure 15 by the insertion of the tabs 28 and 30 into the apertures 32 and 34, respectively, of the printed circuit substrate 12 in order to seat the side wall edge surfaces 27 against the substrate surface 13. The attachment is facilitated and the resulting assembly is strengthened by the positioning pins 21 and 23 that are fitted into pin receiving holes 31 and 33, respectively. The pins 21, 23 are somewhat longer than the tabs 28, 30. Thus, in either manual or automated assembly, the pins 21, 23 provide positioning reference points since they must enter the holes 31, 33 before the tabs 28, 30 can enter and catch in the apertures 32, 34. The four point attachment provided by insertion of the pins 21, 23 and tabs 28, 30, into the respective holes 31, 33 and 32, 34 stabilizes the assembly and prevents accidental dislodgement of the lens and enclosure 15 in subsequent handling and manufacturing operations.

The tabs 28 and 30 each extend from the top wall 22 of the lens and enclosure 15 in a flexible, leg-like manner and have a tapered edge catch 42 and 44, respectively, for engaging a surface of the printed circuit substrate 12 to lock the enclosure 15 in place. As shown in FIGS. 2-4, the enclosure 15 is positioned over the region 17, and the tabs 28 and 30 are pressed into the apertures 32 and 34 until the edge catches 42 and 44 snap into engagement with the edges of the apertures 32 and 34. Once the enclosure 15 is so attached, the side wall edge surfaces 27 contact the substrate 12 in the region 17. Thus, the side walls 26 suspend the lens element 20 formed in the top wall 22 at a predetermined distance above the photosensitive surface 24 so that light from an image is focused by lens 20 onto the surface 24.

In order to minimize the reflection of scattered light through the side walls 26 and onto the surface 24, either the inside or the outside, or both, the surfaces of the side walls 26 may be coated or painted with an opaque coating.

Turning to FIGS. 5-9, they illustrate views of a further embodiment of the invention wherein a discrete lens element 120 is constructed as a separate piece that is intended to be attached to an enclosure 115. In this embodiment, the enclosure 115 is preferably formed of an opaque plastic that inhibits stray light from being inadvertently directed through the side walls 26 and onto the photosensitive surface 24. The centrally disposed discrete lens element 120 has an annular edge 121 that fits against an annular seat 128 formed in a lens element receptacle 122 and surrounding lens aperture 130 formed in the top wall 22. The receptacle 122 is formed with two flexible catches 124 and 126 that hold the edge 121 against the seat 128 and are associated with apertures 132 and 134 (visible in FIG. 6). The enclosure 115 otherwise is constructed and assembled to the printed circuit substrate in the same manner as the first embodiment.

Figure 7:
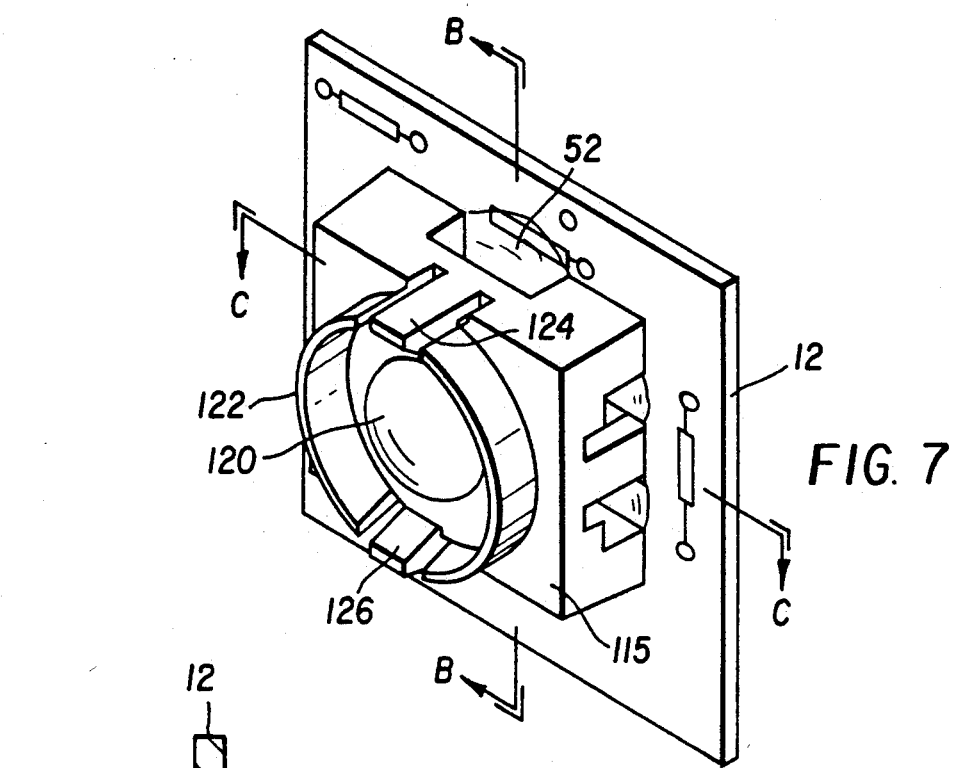
FIG. 7 is an assembled perspective view of the embodiment of FIGS. 5 and 6.

In both embodiments, the side wall edge surfaces 27 are four flat surfaces (visible in FIG. 6) that bear against the substrate surface 13 in the four "footprints" 27' outlined around region 17 (shown in FIG. 2). If it is deemed desirable to effect a stronger attachment, then it is contemplated that an adhesive material may be laid down in the footprints 27' around the region 17 on surface 13 of the substrate 12 that the side wall edge surfaces 27 contact. When assembled as depicted in FIGS. 3 and 7, the adhesive in the footprints of the side wall edge surfaces 27 and around the apertures 32, 34 and pin holes 31, 33 is compressed by the side wall edge surfaces 27 and squeezed out. Alternatively, in order to simplify manufacture, a fillet of adhesive 54 may be applied around the periphery of the side wall 26 and the surface 13 as shown for example in FIGS. 4 and 9.

It is contemplated that the snap-in attachment of the enclosures 15, 115 afforded by the above-described configuration of the tabs 28, 30 and positioning pins 21, 23 will be sufficient with or without adhesive to maintain the enclosure 15 in place for most applications. But in the further attachment embodiment also illustrated in FIGS. 7 and 8, all or a portion of the interior volume 50 within the enclosures 15, 115 may be filled with an optically clear ultraviolet (UV) curable material, such as the dielectric polymer "NORLAND 63" available from NORLAND Products, Inc. or another suitable, optically transparent and colorless epoxy compound. The added encapsulant 52 further stabilizes the attachment of the die 14, wires 38 and enclosures 15, 115 and the discrete lens element 120 through its adhesion to each.

Figure 8:
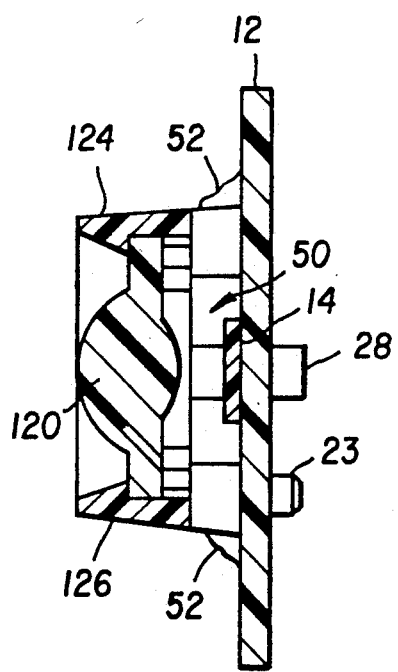
FIG. 8 is a cross-section elevation view taken along lines B—B of FIG. 7 depicting a the attachment of the snap-in lens element to the protective enclosure and the protective enclosure to the printed circuit substrate.
Figure 9:
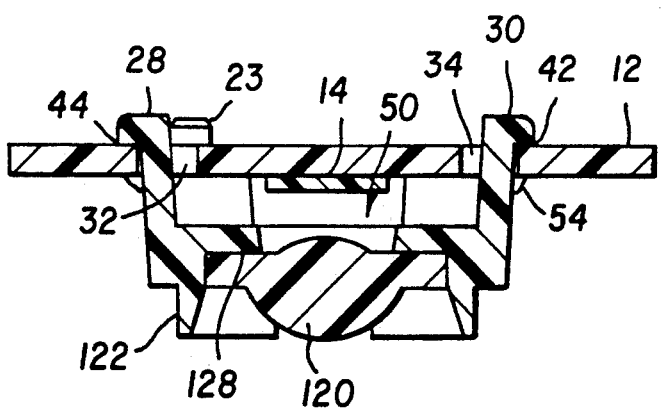
FIG. 9 is a cross-section elevation view taken along lines C—C of FIG. 7.

In practice, the relatively viscous polymer would be deposited in a mass over the IC die 14 or into the volume 50 and compressed as shown in FIGS. 7 and 8 by the plastic enclosure 115 inserted over it. In this process, care must be taken to avoid the formation of bubbles or voids in the optical path between the lens 20, 120 and the photosensitive surface 24.

The illustrated embodiments also show vents 46 cut through a first pair of opposing side walls 26 and vents 48 cut through the other pair of opposing side walls 26. These vents allow trapped air to escape with a portion of the encapsulant 52 which seals the vents as shown in FIGS. 7 and 8, for example. In the second embodiment, a portion of the encapsulant may also enter the catch apertures 132 and 134 and contact a portion of the lens element edge 121. Although vents 46 and 48 are illustrated, it will be understood that solid side walls may be provided that seal the interior volume 50.

The use of the rigid, supported, integral lens element 20 built into the enclosure 15 or the separate lens element 120 snap attached to the enclosure 115 simplifies the manufacturing process and increases the yield of circuit assemblies having a properly focused lens element.

There are thus provided multiple embodiments for attaching the enclosures 15, 115 to the substrate 12 for enclosing an optically active integrated circuit die mounted directly on or in the printed circuit substrate and having a lens element for focusing an image on the photosensitive surface of the die, which provide substantial improvements and advantages over the prior art. The above described and illustrated embodiments are intended to be illustrative of the principles of the present invention and not limited to the specific shape of the enclosure or the number and configuration of attachment mechanisms.

Moreover, while the lens elements are depicted in the top wall 22 of the enclosure 15, 115, it will be understood that the lens and suitable optical light guides or lens elements may be provided to orient the lens element into a side wall 26 to focus at right angles onto the photosensitive surface 24.

While IC die has been described as constituting a photosensitive semiconductor element or array of elements, it will be understood that the invention has application to other miniaturized optically active devices, including LED and other light and radiation emitting devices.

While preferred embodiments of the invention have been illustrated and described, it will be clear that the invention is not so limited. Numerous modifications, changes, variations, substitutions, and equivalents will occur to those skilled in the art without departing from the spirit and scope of the present invention.

I claim:

1. Apparatus for enclosing and focusing light on or from an optically active integrated circuit die mounted on a region of a printed circuit substrate of the type having conductive paths and connected components on at least one major surface thereof, and attached so that the optically active integrated circuit elements are electrically connected to the conductive paths, comprising:
   a lens element;
   an enclosure for supporting the lens element in a wall thereof for focusing the lens element upon the optically active integrated circuit element, the enclosure having side walls; and
   a plurality of tabs extending from the side walls of the enclosure and a like plurality of apertures in the substrate for receiving the tabs, the tabs having catches configured to engage the apertures and maintain the side wall edge surfaces in contact with the substrate surface.

2. The apparatus of claim 1 wherein the attaching means further comprises:
   encapsulant means filling the enclosed volume within the enclosure with a transparent sealing compound extending between the surface of the integrated circuit die and the lens element in the wall of the enclosure.

3. The apparatus of claim 1 wherein the enclosure side walls are provided with side wall edge surfaces and the attaching means further comprises:
   a layer of adhesive between the side wall edge surfaces of the enclosure and the substrate surface.

4. The apparatus of claim 1 wherein the attaching means further comprises:
   a plurality of positioning pins extending from the side wall edge surfaces of the enclosure; and a like plurality of holes extending through the substrate in an arrangement configured to receive the plurality of positioning pins.

5. The apparatus of claim 1 further comprising:
encapsulant means filling the enclosed volume within said enclosure with a transparent sealing compound extending between the surface of the integrated circuit die and the lens element in the wall of the enclosure.

6. The apparatus of claim 1 wherein the enclosure side walls are provided with side wall edge surfaces and the apparatus further comprises:
a plurality of positioning pins extending from the side wall edge surfaces of the enclosure; and
a like plurality of holes extending through the substrate in an arrangement configured to receive the plurality of positioning pins.

7. Apparatus for enclosing and focusing light on or from an optically active integrated circuit die mounted on a region of a printed circuit substrate of the type having conductive paths and connected components on at least one major surface thereof, and attached so that the optically active integrated circuit elements are electrically connected to the conductive paths, comprising:
a discrete lens element having an annular edge and an optical lens;
a discrete supporting enclosure having a lens element receptacle means formed around an aperture in a wall thereof for receiving and retaining said lens element and having side walls extending to side wall edge surfaces adapted to be mounted against the major surface of the printed circuit substrate, the side walls supporting and suspending the lens element above the integrated circuit die in optical focus upon the optically active integrated circuit element, said lens element receptacle means further comprising an annular seat for receiving the annular edge and locking means for holding the annular edge against the annular seat; and
means for attaching the side walls of the enclosure to the substrate independently of the integrated circuit die and enclosing the integrated circuit die within the region of the substrate to protect the die.

8. The apparatus of claim 7 wherein the enclosure side walls are provided with sidewall edge surfaces and the attaching means further comprises:
a plurality of tabs extending from the side walls of the enclosure and a like plurality of apertures in the substrate, the tabs having catches configured to engage the apertures and maintain the side wall edge surfaces in contact with the substrate surface.

9. The apparatus of claim 7 wherein the attaching means further comprises:
a plurality of positioning pins extending from the side wall edge surfaces of the enclosure; and
a like plurality of holes extending through the substrate in an arrangement configured to receive the plurality of positioning pins.

10. The apparatus of claim 7 wherein the attaching means further comprises:
encapsulant means filling the enclosed volume within the unitary enclosure with a transparent sealing compound extending between the surface of the integrated circuit die and the lens element in the wall of the enclosure.

11. The apparatus of claim 7 wherein the enclosure side walls are provided with side wall edge surfaces and the attaching means further comprises:
a layer of adhesive between the side wall edge surfaces of the enclosure and the substrate surface.

* * * * *